United States Patent
Kuo et al.

(10) Patent No.: US 7,847,333 B2
(45) Date of Patent: Dec. 7, 2010

(54) STRUCTURED, ELECTRICALLY-FORMED FLOATING GATE FOR FLASH MEMORIES

(76) Inventors: Charles Kuo, 33224 Arizona St., Union City, CA (US) 94587; Yudong Kim, 18812 Loree Ave., Cupertino, CA (US) 95014

( * ) Notice: Subject to any disclaimer, the term of this patent is extended or adjusted under 35 U.S.C. 154(b) by 239 days.

(21) Appl. No.: 12/055,216

(22) Filed: Mar. 25, 2008

(65) Prior Publication Data

US 2008/0173925 A1 Jul. 24, 2008

Related U.S. Application Data

(62) Division of application No. 11/274,622, filed on Nov. 14, 2005, now Pat. No. 7,374,996.

(51) Int. Cl.
*H01L 29/788* (2006.01)

(52) U.S. Cl. .................. 257/315; 257/314; 257/347; 257/E29.3

(58) Field of Classification Search .................. 257/315, 257/E29.3
See application file for complete search history.

(56) References Cited

U.S. PATENT DOCUMENTS

| 4,409,723 | A | 10/1983 | Harari |
|---|---|---|---|
| 6,214,671 | B1 | 4/2001 | Sun |
| 6,225,162 | B1 | 5/2001 | Lin et al. |
| 6,281,074 | B1 | 8/2001 | Chang |
| 6,580,137 | B2 | 6/2003 | Park |
| 6,630,383 | B1 | 10/2003 | Ibok et al. |
| 6,908,817 | B2 | 6/2005 | Yuan |
| 6,963,104 | B2 | 11/2005 | Wu et al. |
| 7,045,419 | B2 | 5/2006 | Luoh et al. |
| 7,105,406 | B2 | 9/2006 | Lutze et al. |
| 2003/0122183 | A1 | 7/2003 | Jang |
| 2005/0282337 | A1 | 12/2005 | Shyu et al. |
| 2006/0216889 | A1 | 9/2006 | Chung et al. |

*Primary Examiner*—N Drew Richards
*Assistant Examiner*—Mamadou Diallo
(74) *Attorney, Agent, or Firm*—Blakely, Sokoloff, Taylor & Zafman LLP (57) ABSTRACT

Semiconductor memory devices and methods to fabricate thereof are described. A first gate base is formed on a first insulating layer on a substrate. A first gate fin is formed on the first gate base. The first gate fin has a top and sidewalls. Next, a second insulating layer is formed on the top and sidewalls of the first gate fin and portions of the first gate base. A second gate is formed on the second insulating layer. Source and drain regions are formed in the substrate at opposite sides of the first gate base. In one embodiment, the first gate fin includes an undoped polysilicon and the first gate base includes an n-type polysilicon. In another embodiment, the first gate fin includes an undoped amorphous silicon and the first gate base includes an n-type amorphous silicon.

10 Claims, 12 Drawing Sheets

STRUCTURED, ELECTRICALLY-FORMED FLOATING GATE FOR FLASH MEMORIES

This application is a divisional application of co-pending U.S. patent application Ser. No. 11/274,622, filed on Nov. 14, 2005, entitled "A STRUCTURED, ELECTRICALLY-FORMED FLOATING GATE FOR FLASH MEMORIES", and claims a priority benefit thereof.

FIELD

Embodiments of the invention relate generally to the field of semiconductor manufacturing, and more specifically, to semiconductor memory devices and methods to fabricate thereof.

BACKGROUND

Semiconductor memories are used to store and retrieve large quantities of digital data at electronic speeds. Semiconductor memory features are continually being scaled down in size to integrate greater numbers of memory cells into a single chip. A typical semiconductor memory consists of an array of memory cells organized in rows and columns. Typically, the memory cells are connected along the rows through word lines, and along the columns through bit lines. Each memory cell therefore has a unique memory location, or address, which can be accessed through selection of the appropriate word and bit line, for the purpose of either reading or writing data. The contents of all of the memory array cells can be erased simultaneously in flash memories, e.g., flash EEPROMs, through the use of an electrical signal.

Figure 1:
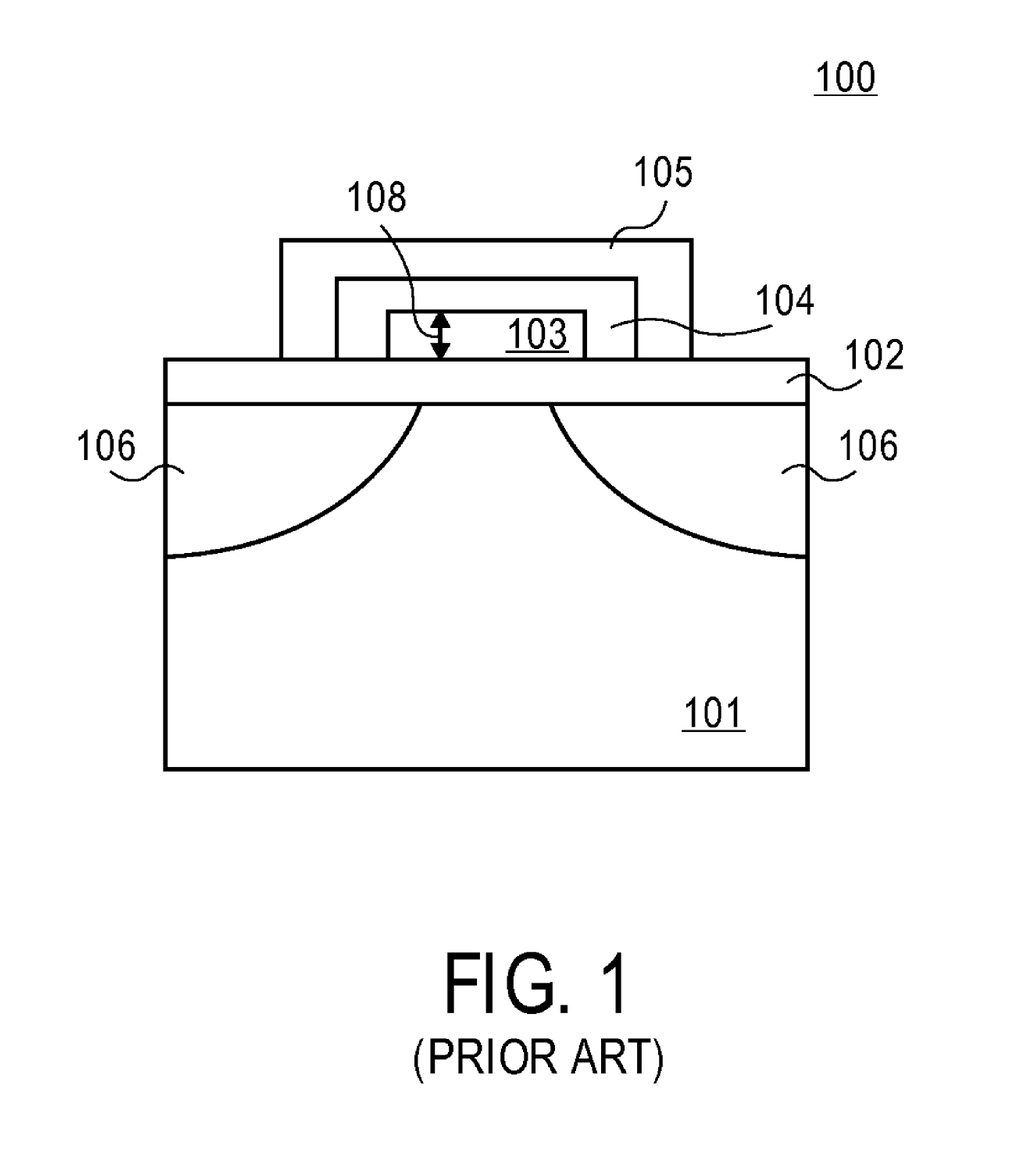
FIG. 1 shows a cross sectional view of a typical flash EEPROM cell.

FIG. 1 shows a cross sectional view 100 of a typical flash EEPROM cell. Two layers of polysilicon separated by an interpoly dielectric layer 104 form a control electrode 105 over a floating gate 103, as shown in FIG. 1. Floating gate 103 is deposited on a gate oxide 102 on a p-type silicon substrate 101. N$^+$-type source and drain regions 106 are formed in substrate 101 at opposite sides of floating gate 103. Floating gate 103 does not have an electrical connection, and is capacitively coupled to control gate 105 through interpoly dielectric layer 104. Currently, a gate coupling ratio of control gate 105 to floating gate 103 ("GCR") is only about 50% to 60%. That is, out of, e.g., 10 volts applied to control electrode 105, only 5-6 volts is coupled to floating gate 103 that limits the performance of a memory cell. Typically, to increase the coupling ratio of control gate 105 to floating gate 103, the thickness 108 of floating gate 103 is increased. That increases the surface area that couples floating gate 103 to control gate 105 through a wrap around feature. In a memory array, however, the increased thickness of floating gate 103, invokes a parasitic floating gate to floating gate coupling of adjacent memory cells, for example, across a word line.

Additionally, the parasitic floating gate to floating gate coupling between adjacent memory cells increases as feature sizes of memory integrated circuits decrease to incorporate more memory cells into a single chip. The parasitic floating gate-to-floating gate coupling between gates of adjacent memory cells severely impacts the operation of a memory integrated circuit.

BRIEF DESCRIPTION OF THE DRAWINGS

The present invention is illustrated by way of example and not limitation in the figures of the accompanying drawings, in which like references indicate similar elements.

DETAILED DESCRIPTION

In the following description, numerous specific details, such as specific materials, types of dopants, dopant concentrations, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great detail to avoid unnecessarily obscuring this description. Those of ordinary skill in the art, with the included description, will be able to implement appropriate functionality without undue experimentation.

Semiconductor memories and methods to fabricate thereof are described herein. Referring to FIG. 2R, a cross sectional view of one embodiment of a semiconductor memory device is shown. A gate 231 having an inverse T shape is formed on an insulating layer 202 on a substrate 201, as shown in FIG. 2R. Gate 231 has a gate base 233 on insulating layer 202. Gate 231 has a gate fin 218 formed on gate base 233. Gate base 233 is wider than gate fin 218, as shown in FIG. 2R. Gate fin 218 has a top 228 and opposing sidewalls 229. In one embodiment, gate 231 is a PLY1 gate fabricated from polycrystalline silicon ("polysilicon"), or amorphous silicon on insulating layer 202 of silicon based oxide on a p-type silicon substrate 201. In one embodiment, the fin 218 is fabricated from an undoped polysilicon and the base 233 is fabricated from an n-type doped polysilicon. In another embodiment, the fin 218 is fabricated from an undoped amorphous silicon and the base 233 is fabricated from an n-type doped amorphous silicon. In yet another embodiment, fin 218 includes an n-type dopant, and base 233 includes an n-type dopant. A source region 208 and a drain region 209 are formed in substrate 201 at opposite sides of gate 231. An insulating layer 219 is formed on gate 231 covering top 228 and sidewalls 229 of fin 218 and portions 232 of base 233. A gate 220 is formed on insulating layer 219. In one embodiment, gate 220 is a PLY 2 gate formed from n-type doped polysilicon, or n-type doped amorphous silicon. In one embodiment, gate 220 is a control gate, and gate 231 is a floating gate of a memory cell. In the memory cell, the information is stored in the floating gate, and the selection of a memory cell in a memory array is controlled by the control gate. The overlapping area between the control gate and the inverse T structured floating gate substantially increases gate coupling ratio ("GCR") of control gate 220 to floating gate 231. For example, during Read/Program/Erase operations of the memory device, the large overlapping area between PLY2 gate and PLY1 gate substantially increases a gate coupling ratio ("GCR") of gate 220, e.g., a control gate, to gate 231, e.g., a floating gate, while minimizing the unwanted, parasitic floating gate-to-floating gate coupling between adjacent memory devices ("cells") in a memory array, e.g., across a word line, as described in further details below with respect to FIGS. 4A-4C and 5A-5D.

Figure 2A:
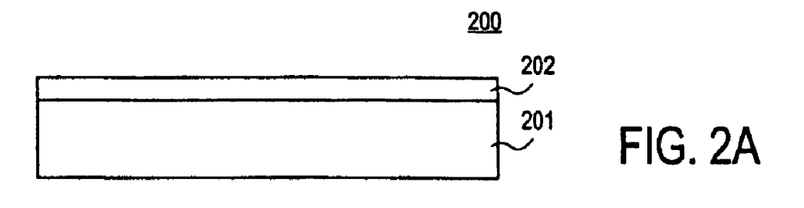
FIG. 2A is a cross-sectional view of one embodiment of a semiconductor structure to fabricate a semiconductor memory device.
Figure 2B:
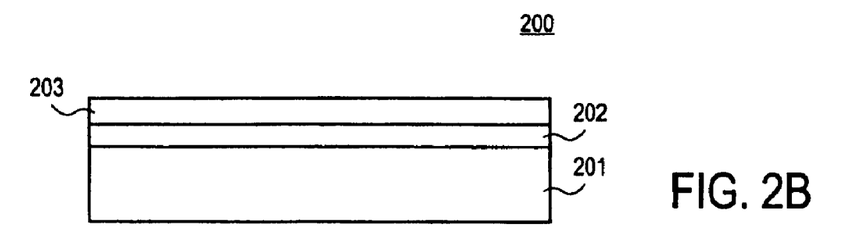
FIG. 2B is a view similar to FIG. 2A, after a first gate layer is deposited on a first insulating layer.
Figure 2C:
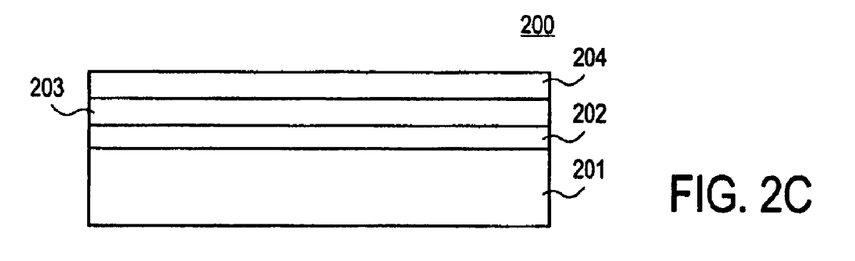
FIG. 2C is a view similar to FIG. 2B, after a pad oxide layer is deposited on the first gate layer.
Figure 2D:
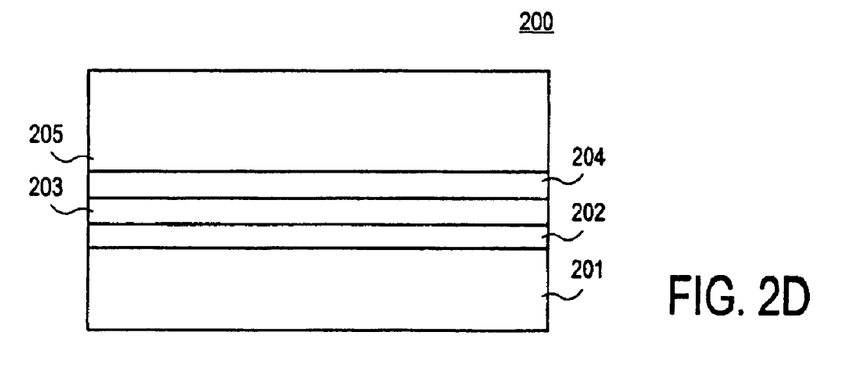
FIG. 2D is a view similar to FIG. 2C, after a first nitride layer is deposited on the pad oxide layer.
Figure 2E:
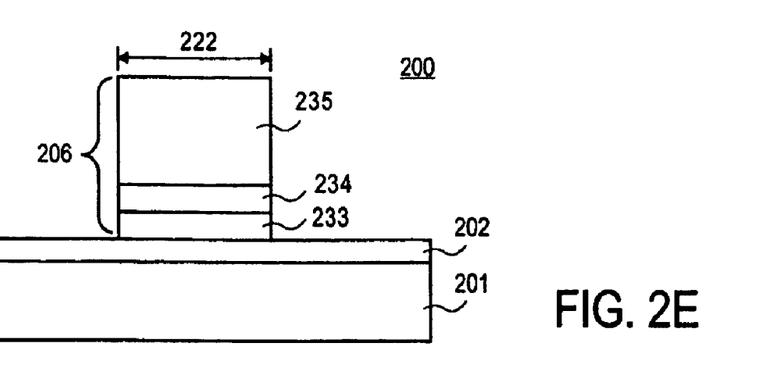
FIG. 2E is a view similar to FIG. 2D, after a stack including a first gate base, a pad oxide, and a first nitride, is formed on the first insulating layer.
Figure 2F:
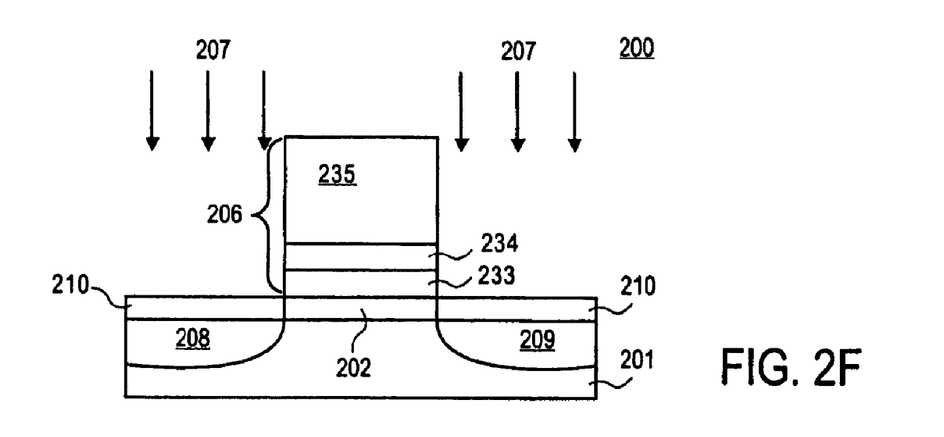
FIG. 2F is a view similar to FIG. 2E, after a source region and a drain region are formed.
Figure 2G:
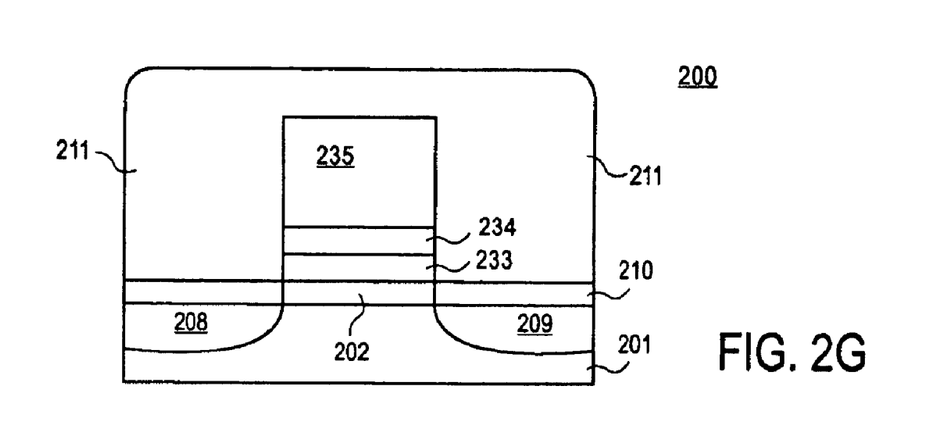
FIG. 2G is a view similar to FIG. 2F, after a high density oxide layer is formed at opposite sides of the stack.
Figure 2H:
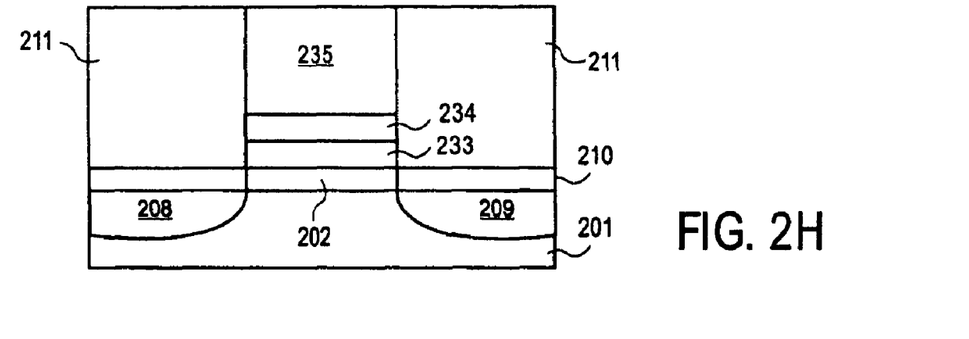
FIG. 2H is a view similar to FIG. 2G, after the high density oxide layer is removed from the top of the nitride.
Figure 2I:
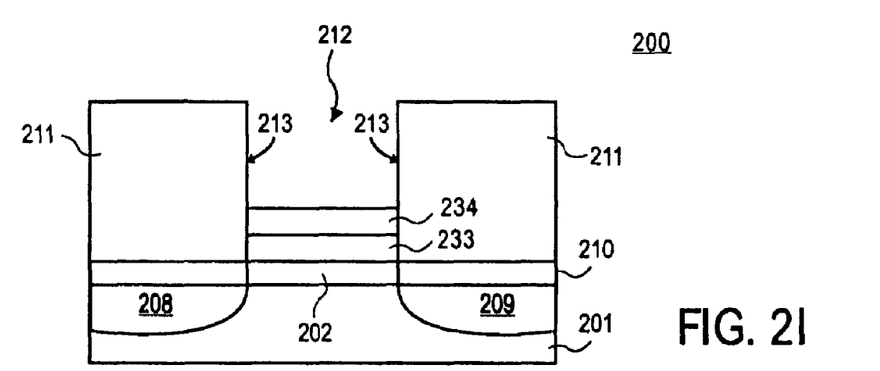
FIG. 2I is a view similar to FIG. 2H, after the first nitride is removed to expose the top of the pad oxide.
Figure 2J:
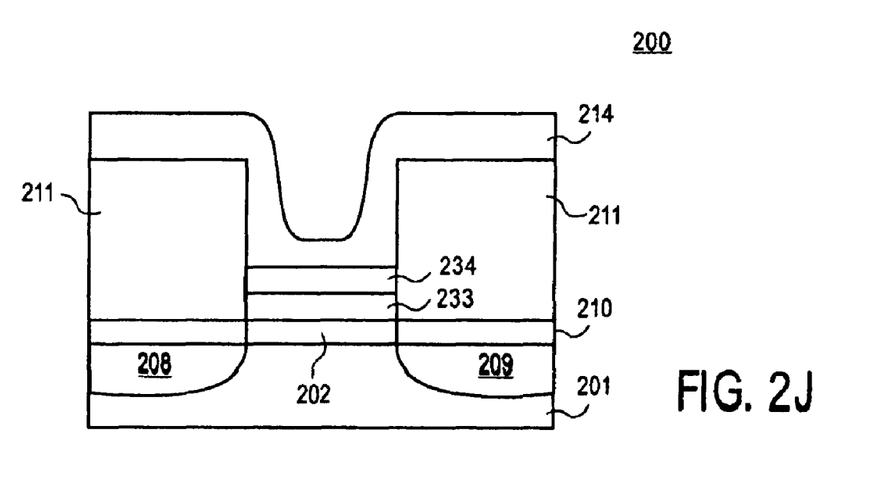
FIG. 2J is a view similar to FIG. 2I, after a spacer layer is deposited into a recess on the top of the pad oxide.
Figure 2K:
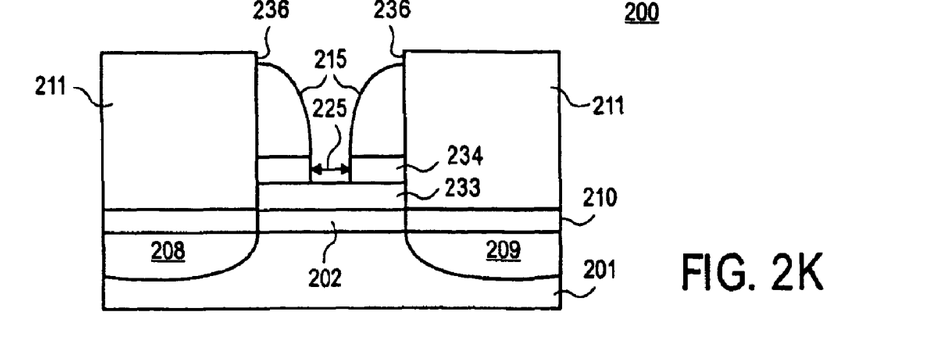
FIG. 2K is a view similar to FIG. 2J, after the spacer layer is anisotropically etched back through a portion of pad oxide to expose a portion of the first gate base.
Figure 2L:
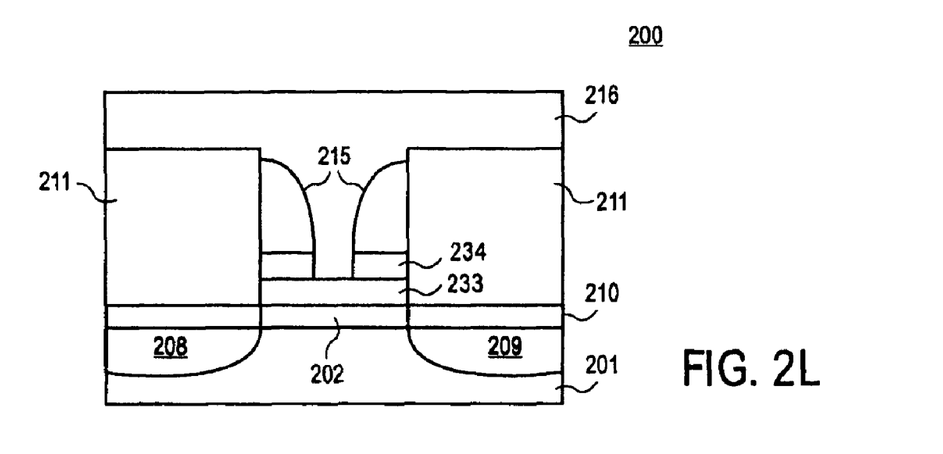
FIG. 2L is a view similar to FIG. 2K, after a fin layer is deposited on the first gate base.
Figure 2M:
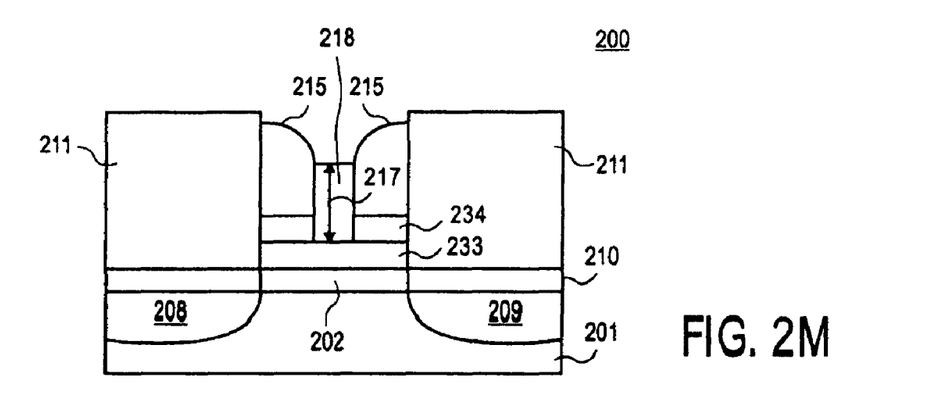
FIG. 2M is a view similar to FIG. 2L, after the fin layer is etched back to expose top portions of the high density oxide layer and to leave a vertical portion of the fin layer between the spacers.
Figure 2N:
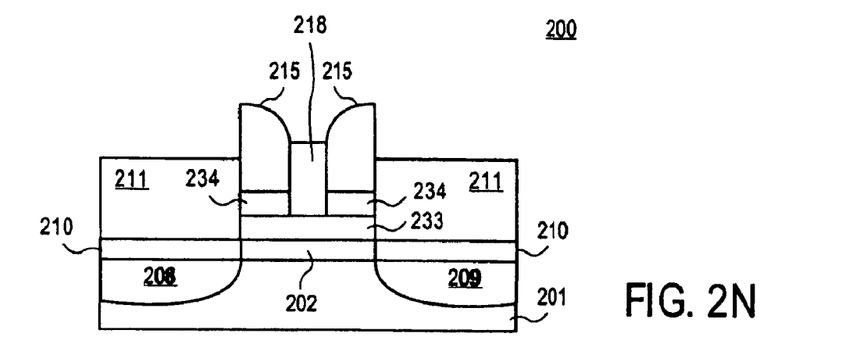
FIG. 2N is a view similar to FIG. 2M, after the high density oxide layer is receded.
Figure 2O:
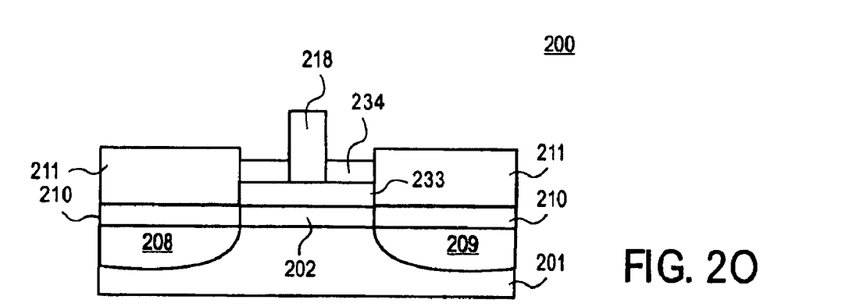
FIG. 2O is a view similar to FIG. 2N, after removing the spacers 215 from the pad oxide.
Figure 2P:
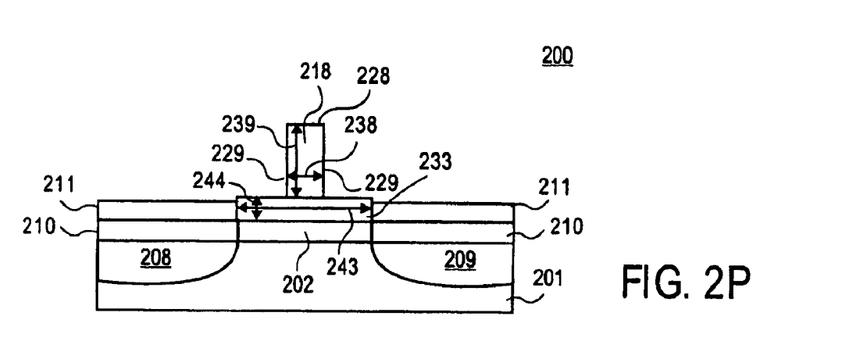
FIG. 2P is a view similar to FIG. 2O, after the pad oxide is removed.
Figure 2Q:
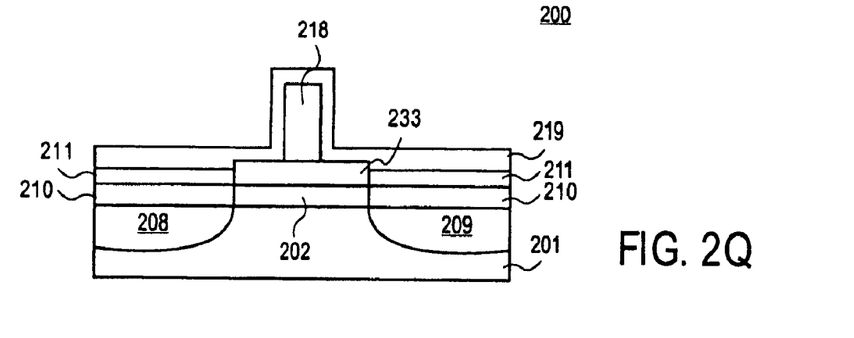
FIG. 2Q is a view similar to FIG. 2P, after a second insulating layer is deposited.
Figure 2R:
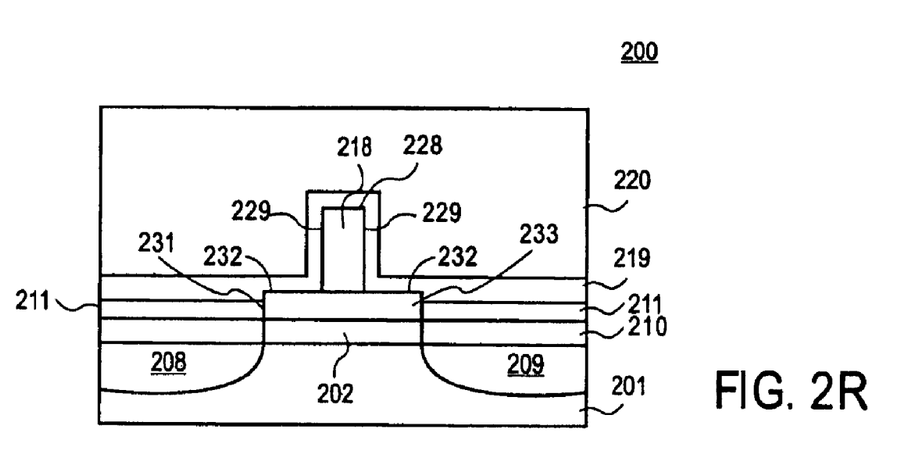
FIG. 2R is a cross sectional view of one embodiment of a semiconductor memory device.

FIG. 2A is a cross-sectional view 200 of one embodiment of a semiconductor structure to fabricate a semiconductor memory device shown in FIG. 2R. As shown in FIG. 2A, an insulating layer 202 is deposited on a substrate 201. In one embodiment, substrate 201 is a monocrystalline silicon substrate having a concentration of p-type dopants, e.g., boron, aluminum, gallium, or indium, in the approximate range of $10^{17}$ cm$^{-3}$ to $10^{18}$ cm$^{-3}$. In alternate embodiments, substrate 201 may comprise any material to make any of integrated circuits, passive, and active devices. Substrate 201 may include insulating materials that separate such active and passive devices from a conductive layer or layers that are formed on top of them. In one embodiment, substrate 201 is a p-type monocrystalline silicon ("Si") substrate and insulating layer 202 is a silicon based oxide, e.g., silicon dioxide. In alternate embodiments, insulating layer 202 may be any one, or a combination of, sapphire, silicon dioxide, silicon nitride, or other insulating materials. In one embodiment, insulating layer 202 of silicon based oxide is deposited to the thickness thin enough to provide a tunneling effect for a memory device, and thick enough to prevent any leakage in the memory device. In one embodiment, the thickness of insulating layer 202 of silicon dioxide formed on substrate 201 of a p-type monocrystalline Si is in the approximate range of 6 nanometers ("nm") to 20 nm. More specifically, the thickness of insulating layer 202 is between 9 nm to 15 nm. In one embodiment, insulating layer 202 of silicon dioxide is grown on substrate 201 of a p-type monocrystalline Si using one of techniques known to one of ordinary skill in the art of the semiconductor manufacturing, e.g., using a thermal oxidation of substrate 201. In alternate embodiments, insulating layer 202 may be formed on substrate 201 by blanket deposition, e.g., chemical vapor deposition ("CVD"), spin coating, or by using any other technique known to one of ordinary skill in the art of the semiconductor manufacturing.

FIG. 2B is a view 200 similar to FIG. 2A, after a gate layer 203 is deposited on insulating layer 202. Gate layer 203 is deposited to the thickness thin enough to minimize parasitic coupling that may occur between adjacent memory cells, e.g., across a single or between adjacent word lines in a memory array. In one embodiment, gate layer 203 is deposited to the thickness in the approximate range of 25 nm to 75 nm. More specifically, the thickness of gate layer 203 on insulating layer 202 is about 50 nm. In one embodiment, PLY1 gate layer 203 deposited on insulating layer 202 of silicon dioxide is in-situ doped an n-type polysilicon layer, amorphous silicon layer, or any combination thereof. In one embodiment, PLY1 gate layer 203 is doped with the n-type dopants, e.g., phosphorus ("P"), arsenic ("As"), antimony ("Sb"), or any combination thereof, to a concentration in the approximate range of $10^{19}$ cm$^{-3}$ to $10^{20}$ cm$^{-3}$. In situ-doping with an n-type dopant is performed by introducing gases having an n-type dopant while depositing e.g., by a CVD deposition of gate layer 203 of undoped polysilicon on insulating layer 202 of silicon dioxide. In one embodiment, PLY1 gate layer 203 is doped with a n-type dopant having a slow speed of diffusion, e.g., arsenic, to prevent the dopants from quickly diffusing across gate layer 203 into a fin formed later on in a process described in further details below. In another embodiment, n-type dopants may be introduced into gate layer 203 by an ion implantation. In alternate embodiments, gate layer 203 of polysilicon or amorphous silicon is deposited on insulating layer 202 of silicon based oxide by one of technique known in the art of the semiconductor manufacturing, for example, by chemical vapor deposition (CVD), or physical vapor deposition (PVD).

FIG. 2C is a view 200 similar to FIG. 2B, after a pad oxide layer 204 is deposited on gate layer 203. Pad oxide layer 204 is deposited on gate layer 203 to the thickness in the approximate range of 25 nm to 75 nm. More specifically, pad oxide layer 204 is deposited to the thickness about 50 nm. In one embodiment, pad oxide layer 204 deposited on PLY1 gate layer 203 of polysilicon or amorphous silicon is silicon based oxide, e.g., silicon dioxide. In one embodiment, pad oxide layer 204 of silicon based oxide is deposited on PLY 1 gate layer 203 of polysilicon or amorphous silicon. Pad oxide layer 204 may be deposited on PLY 1 gate layer 203 using one of techniques known to one of ordinary skill in the art of the semiconductor manufacturing, e.g., using a thermal oxidation technique, or blanket deposition, e.g., CVD deposition.

FIG. 2D is a view 200 similar to FIG. 2C, after a nitride layer 205 is deposited on pad oxide layer 204. Nitride layer 205 is deposited on pad oxide layer 204 to the thickness in the approximate range of 75 nm to 125 nm. More specifically, the thickness of nitride layer 205 is about 100 nm. In one embodiment, a material for nitride layer 205 is a silicon nitride, boron nitride, magnesium nitride, or any combination thereof. In one embodiment, nitride layer 205 of silicon nitride is deposited on pad oxide layer 204 of silicon dioxide. Nitride layer 205 may be deposited on pad oxide layer 204 using one of techniques known to one of ordinary skill in the art of the semiconductor manufacturing, e.g., using a blanket deposition, including CVD. Next, a photoresist (not shown) is deposited on top of nitride layer 205 to pattern and then etch gate layer 203, pad oxide layer 204, and nitride layer 205 down to insulating layer 202 to form a stack 206 having a width 222, as shown in FIG. 2E. The photoresist (not shown) deposited on top of nitride layer 205 is patterned to expose portions (not shown) of nitride layer 205 to be removed to form stack 206. Depositing and patterning the photoresist to form the stack 206 having the width is known to one of ordinary skill in the art of the semiconductor manufacturing.

FIG. 2E is a view 200 similar to FIG. 2D, after a stack 206 including gate base 233, pad oxide 234, and nitride 235 is formed on insulating layer 202. As shown in FIG. 2E, the width 222 of stack 206 determines the length of a gate base 233. In one embodiment, stack 206 on insulating layer 202 includes silicon nitride layer on top of a silicon based pad oxide on top of a layer of polysilicon or amorphous silicon. In one embodiment, the width of stack 206 is in the approximate range of 50 nm to 200 nm. More specifically, the width of stack 206 is about 150 nm. Stack 206 is formed by selectively etching nitride layer 205, pad oxide layer 204, and gate layer 203 while leaving insulating layer 202 intact. Selective etching to form stack 206 may be performed by dry etching, wet etching, or a combination thereof and is known to one of ordinary skill in the art of semiconductor manufacturing.

Figure 3:
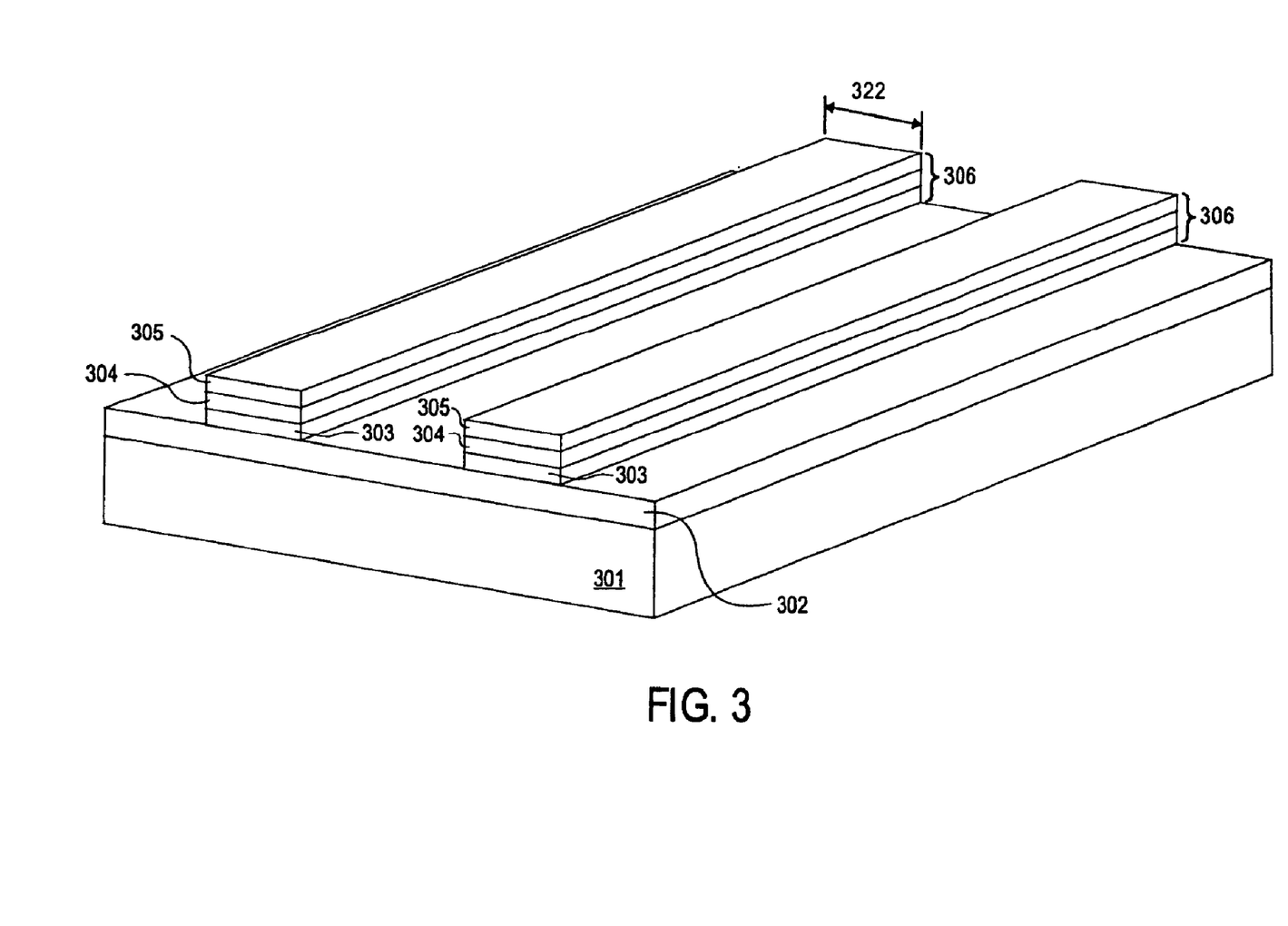
FIG. 3 shows a perspective view of one embodiment of one or more stacks formed on a first insulating layer on a substrate.

FIG. 3 shows a perspective view of one embodiment of one or more stacks 306 formed on insulating layer 302 on a substrate 301 as described above with respect to FIGS. 2A-2E. Each of stacks 306 shaped as a bar on insulating layer 302 includes a nitride 305 on top of a pad oxide 304 on top of a gate base 303, as shown in FIG. 3. Each of stacks 306 has the width 322 that defines the length of gate base 303, as described above with respect to FIG. 2E. As shown in FIG. 3, one or more stacks 306 on insulating layer 302 are used to form one or more bit lines for a semiconductor memory integrated circuit, as described in further details below with respect to FIGS. 5A-5D. Further, referring back to FIG. 2E, source and drain regions are formed in substrate 201 through portions of insulating layer 202 at opposite sides of stack 206.

FIG. 2F is a view similar to FIG. 2E, after a source region 208 and a drain region 209 are formed in substrate 201. In one embodiment, source region 208 and drain region 209 are formed by implanting 207 ions of n-type dopants, e.g., nitrogen ("N"), phosphorus ("P"), arsenic ("As"), antimony ("Sb"), or any combination thereof, in substrate 201 of a p-type silicon. As shown in FIG. 2F, the dopants are introduced into substrate 201 through portions 210 of insulating layer 202 at opposite sides of stack 206. In one embodiment, the concentration of n-type dopants in source region 208 and drain region 209 is in the approximate range of $10^{19}$ cm$^{-3}$ to $10^{20}$ cm$^{-3}$. Solid solubility may limit maximum dopant concentration. Using ion implantation to form a source region and a drain region in a silicon substrate is known to one of ordinary skill in the art of semiconductor manufacturing.

FIG. 2G is a view similar to FIG. 2F, after a high density oxide layer 211 is formed at opposite sides of stack 206. As shown in FIG. 2G, high density oxide layer 211 is deposited on a top of nitride 235 and on portions 210 of insulating layer 202 at opposite sides of stack 206. In one embodiment, high density oxide layer 211 is a high density plasma oxide e.g., silicon oxide, produced by high density plasma enhanced chemical vapor deposition ("PECVD"). The PECVD is known to one of ordinary skill in the art of semiconductor manufacturing. In alternate embodiments, high density oxide layer 211 is formed on insulating layer 202 of silicon based oxide using one of techniques known to one of ordinary skill in the art of the semiconductor manufacturing, e.g., a thermal oxidation, blanket deposition, e.g. a CVD deposition. In one embodiment, high density oxide layer 211 is deposited on insulating layer 202 to fill in gaps between one or more stacks 306 shown in FIG. 3 to insulate one or more bit lines formed later on in the process.

FIG. 2H is a view similar to FIG. 2G, after high density oxide layer 211 is removed from the top of nitride 235. As shown in FIG. 2H, high density oxide layer 211 deposited on portions 210 of insulating layer 202 is adjacent to sides of gate base 203, pad oxide 234, and nitride 235 of stack 206. In one embodiment, a high density oxide layer 211 is polished back to expose the top of silicon nitride 235 using, e.g., a chemical-mechanical polishing ("CMP") technique known to one of ordinary skill in the art of the semiconductor manufacturing. The chemical-mechanical polishing removes the high density oxide layer 211 from the top of nitride 235 such that the top surface of nitride 235 is substantially planar with the top surface of the high density oxide layer 211 deposited on portions 210 of insulating layer 202, as shown in FIG. 2H.

FIG. 2I is a view similar to FIG. 2H, after nitride 235 is selectively removed to expose the top of pad oxide 234. As shown in FIG. 2I, nitride 235 is removed to form a recess 212 with exposed internal sidewalls 213 of high density oxide layer 211. Nitride 235 is removed using an etchant that selectively removes the material of nitride 235 over the other materials of pad oxide 234 and high density oxide layer 211. In one embodiment, silicon nitride 235 is selectively wet etched with a hot phosphoric acid while leaving silicon based pad oxide 234 and high density oxide layer 211 intact.

FIG. 2J is a view similar to FIG. 2I, after spacer layer 214 is deposited into recess 212 on the top of pad oxide 234 and top portions of high density oxide layer 211 to form spacers covering internal sidewalls 213 of high density oxide layer 211. The deposition thickness of the spacer layer determines the width of the subsequently formed spacers. In one embodiment, spacer layer 214 is deposited into recess 212 and on the top of pad oxide 234 to the thickness in the approximate range of 20 nm to 70 nm. A material of spacer layer 214 has the selectivity against high density oxide layer 211. That is, the material of spacer layer 214 may be selectively etched later on in the process while substantially preserving the material of high density oxide layer 211. An exemplary material for spacer layer 214 is a nitride, such as silicon nitride, boron nitride, magnesium nitride, and the like, formed by any process known to one of ordinary skill in the semiconductor manufacturing for depositing a nitride film. For example, blanket deposition of spacer layer 214 of a nitride may be performed using Bistertiarybutylaminosilane (BTBAS) process, an atomic layer deposition (ALD) process, or a hotwall process (ammonia+Silane).

FIG. 2K is a view similar to FIG. 2J, after spacer layer 214 is anisotropically etched back through a portion of pad oxide 234 to expose a portion of gate base 233 and the top portions of high density oxide layer 211. Spacer layer 214 and portion of pad oxide 234 are etched back selectively such that high density oxide layer 211 is left substantially intact, as shown in FIG. 2K. In one embodiment, spacer layer 214 of a nitride is etched back using a fluorine (F)-based dry etching. Spacers 215 formed on portions of pad oxide 234 over gate base 233 cover sidewalls 213, as shown in FIG. 2K. The width 225 of the exposed portion of gate base 233 determines the width of a fin formed later on in the process. In one embodiment, width 225 of exposed portion is in the approximate range of 20 nm to 70 nm. More specifically, the width 225 is about 50 nm. As shown in FIG. 2K, upper parts 236 of sidewalls 213 may be slightly exposed as a result of etching back through pad oxide 234 to expose the portion of gate base 233. FIG. 2L is a view similar to FIG. 2K, after a fin layer 216 is deposited on the gate base 233. As shown in FIG. 2K, fin layer 216 fills in the area between spacers 215 and covers top portions of high density oxide layer 211. In one embodiment, fin layer 216 is undoped polysilicon, and gate base is an n-type doped polysilicon. In another embodiment, fin layer 216 is undoped amorphous silicon, and gate base is an n-type doped amorphous silicon. In yet another embodiment, both fin layer 216 and gate base 233 are fabricated from the same material having with the same type of dopant, e.g., n-type doped polysilicon, n-type doped amorphous silicon, or a combination thereof. In alternate embodiments, the concentration of n-type dopants in fin layer 216 of polysilicon or amorphous silicon may vary from about zero to about $10^{20}$ cm$^{-3}$ and the concentration of n-type dopants in gate base 233 of polysilicon or amorphous silicon may vary in the approximate range of $10^{19}$ cm$^{-3}$ to $10^{20}$ cm$^{-3}$. In one embodiment, fin layer 216 of polysilicon or amorphous silicon is deposited on gate base 233 with a CVD technique. The CVD technique is known to one of ordinary skill in the art of the semiconductor manufacturing.

FIG. 2M is a view similar to FIG. 2L, after fin layer 216 is etched back to expose top portions of high density oxide layer 211 and to leave a vertical portion of fin layer 218 ("fin") between spacers 215. In one embodiment, fin layer 216 of polysilicon or amorphous silicon is etched back using dry etching, e.g., with chlorine. In one embodiment, the thickness 217 of the vertical portion of fin layer 218 is in the approximate range of 50 nm to 200 nm. More specifically, the thickness 217 is about 130 nm.

FIG. 2N is a view similar to FIG. 2M, after high density oxide layer 211 is receded without exposing gate base 233. High density oxide layer 211 is receded while preserving nitride spacers 215. In one embodiment, high density oxide layer 211 is receded using wet etching with a hydrofluoric acid ("HF").

FIG. 2O is a view similar to FIG. 2N, after removing spacers 215 from pad oxide 234. Spacers 215 are removed while leaving pad oxide 234 and underlying gate base 233 intact. In one embodiment, spacers 215 of silicon nitride are removed by wet etching with a hot phosphoric acid. Wet etching with the hot phosphoric acid is known to one of ordinary skill in the art. Pad oxide 234 protects gate base 233, e.g., against pitting, during removal of nitride spacers 215 with the hot phosphoric acid.

FIG. 2P is a view similar to FIG. 2O, after pad oxide 234 is removed exposing portions of a top surface of gate base 233. Pad oxide 234 is selectively removed while leaving gate base 233 unaffected. In one embodiment, pad oxide 234 of silicon oxide is removed by wet etching with a hydrofluoric acid. As shown in FIG. 2P, fin 218 is formed on gate base 233. Fin 218 has a top 228 and opposing sidewalls 229, as shown in FIG. 2P. High density oxide layer 211 may be slightly receded as a result of removal of pad oxide 234, as shown in FIG. 2P. In one embodiment, fin 218 has the thickness 239 in the approximate range of 100 nm to 200 nm and the width 238 in the approximate range of 20 nm to 70 nm. More specifically, the thickness 239 is about 130 nm and the width 238 is about 50 nm. Gate base 233 has the thickness 244 in the approximate range of 25 nm to 75 nm, and the length 243 in the approximate range of 100 nm to 200 nm.

FIG. 2Q is a view similar to FIG. 2P, after insulating layer 219 is deposited. As shown in FIG. 2Q, insulating layer 219 covers top 228 and sidewalls 229 of fin 218 and portions of the top surface of gate base 233. In one embodiment, insulating layer 219 is an interpoly dielectric layer, e.g., oxide/nitride/oxide stack, or a silicon dioxide. Depositing the inter-poly dielectric layer may be performed using one of techniques known to one of ordinary skill in the art of the semiconductor manufacturing, e.g., a CVD technique. In one embodiment, insulating layer 219 of the inter-poly dielectric has an electrical thickness in the approximate range of 75 angstroms (Å) to 200 Å, and more specifically, about 110 Å.

Further, referring back to FIG. 2R described above, gate layer 220 is deposited on insulating layer 219 to form a control gate of a flash memory device. In one embodiment, gate layer 220 of polysilicon or amorphous silicon deposited on insulating layer 219 of inter-layer dielectric is doped with n-type dopants, e.g., arsenic, or phosphorous, with the concentration in the approximate range of $10^{20}$ cm$^{-3}$. In one embodiment, the n-type dopants are introduced into gate layer 220 by ion implantation. In one embodiment, gate layer 220 of polysilicon or amorphous silicon is deposited on insulating layer 219 of the inter-layer dielectric to the thickness in the approximate range of 150 nm-250 nm. Further, to fabricate a memory integrated circuit, gate layer 220 is patterned and etched to form a plurality of word lines as described in further details below with respect to FIGS. 5A-5D. Patterning and etching gate layer 220 to form word lines may be performed using techniques known to one of ordinary skill in the art of semiconductor manufacturing. In one embodiment, semiconductor structure 200 is annealed to activate n-type dopants in polysilicon or amorphous silicon material of gates and in source/drain regions. The annealing conditions are such to prevent diffusion of dopants from PLY1 base to a PLY1 fin. For example, for an arsenic doped PLY1 base and an undoped PLY1 fin, the annealing is performed at 900 C to 1000 C for a period of time in the approximate range of 10 sec to 30 seconds. Such a short period of time in the approximate range of 10 sec to 30 seconds is used to reduce the diffusion of arsenic into PLY1 fin at high temperatures. Additionally, because thickness 239 of fin 218 is comparable with the length 243 of gate base 233, n-type dopants, e.g., arsenic, are not expected to move substantially from n-type doped PLY1 base up into an undoped PLY1 fin. Annealing of semiconductor structure 200 may be performed using techniques known to one of ordinary skill in the art of semiconductor manufacturing.

Figure 5A:
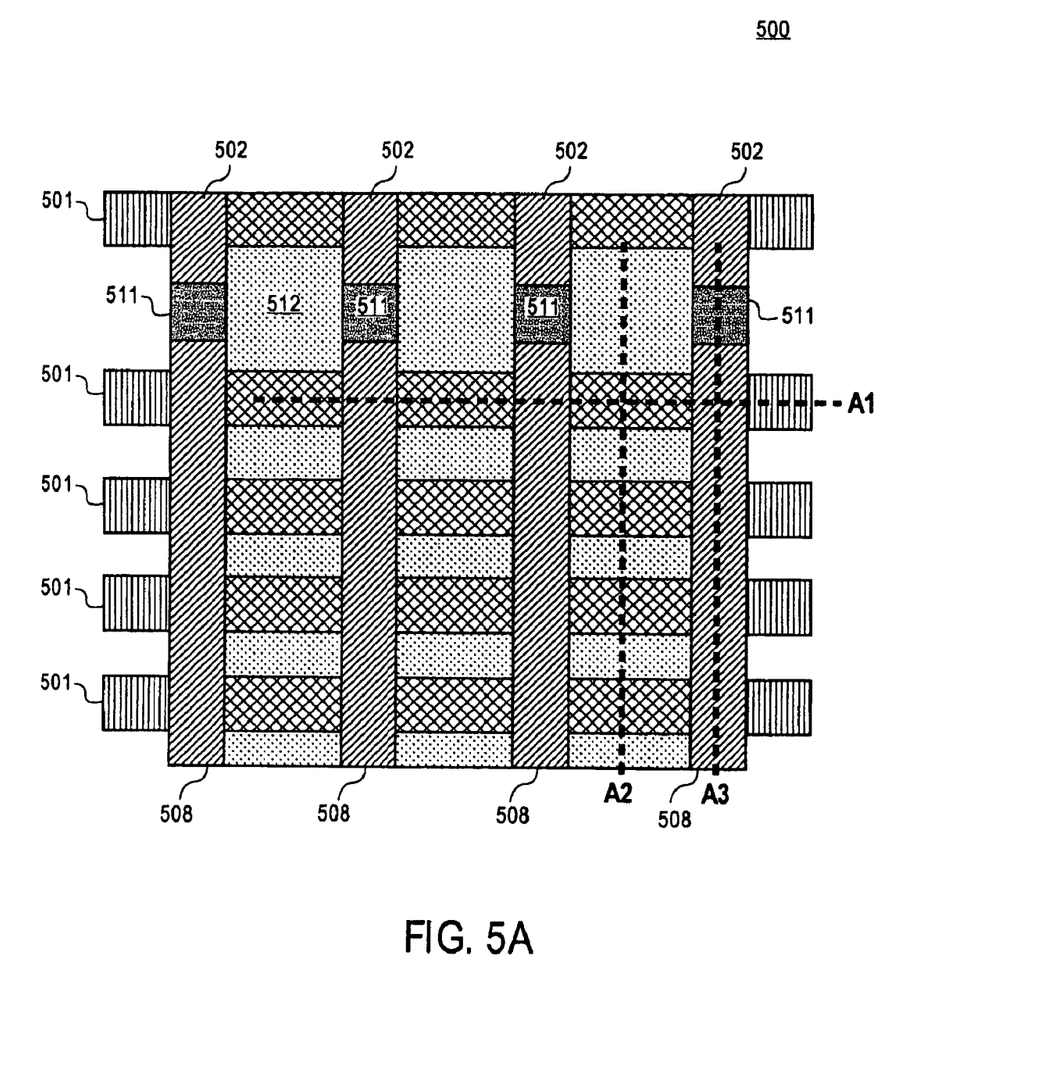
FIG. 5A shows a top view of a block of one embodiment of a flash memory integrated circuit.

FIG. 5A shows a top view of a block 500 of one embodiment of a flash memory integrated circuit fabricated using methods described above with respect to FIGS. 2A-2P. Block 500 comprises a plurality of memory cells (not shown) laid out in a plurality of rows 501 and columns 502, as shown in FIG. 5A. In the memory integrated circuit, rows 501, are formed, for example, in word line direction, and columns 502 are formed, for example, in bit line direction. In one embodiment, the distance between each of columns 502 is less than 50 nm, and the distance between each of rows is less than 50 nm. A dielectric 512 is deposited between columns 502 and rows 502. Via 511 are used to connect metal lines 508 along columns 502 to drain regions of memory cells (not shown).

Figure 5B:
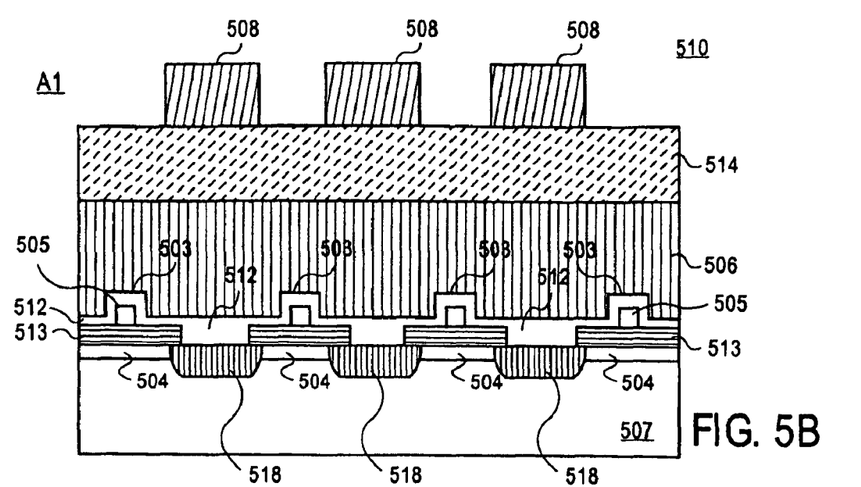
FIG. 5B shows a cross-sectional view of the block of one embodiment of a flash memory integrated circuit across line A1 in FIG. 5A.

FIG. 5B shows a cross-sectional view 510 of block 500 across line A1 in FIG. 5A. As shown in FIG. 5B, block 500 comprises a plurality of flash memory cells 503. Each of memory cells 503 comprises a polysilicon or amorphous silicon floating gate ("PLY1") having fin 505 and base 513, as shown in FIG. 5B. Floating gate base 513 is deposited on tunnel oxide layer 504 on a substrate 506. Such a structured shape of the floating gate having fin 505 and base 513 reduces the amount of floating gate surface area which is exposed to an adjacent bit that reduces a parasitic floating gate-to-floating gate coupling ratio between adjacent memory cells. Source/drain regions 518 are formed in substrate 506 at opposite sides of the floating gate. An inter-poly dielectric layer 512 is deposited on the floating gate covering fin 505 and portions of floating gate base 513. A polysilicon or amorphous silicon control gate ("PLY2") 506 is deposited on inter-poly dielectric layer 512.

Referring to FIG. 5A, a plurality of word lines are formed by patterning and etching PLY2 layer across rows 501. To form word lines, dry etching of PLY2 layer is used. Dry etching of PLY2 layer is known to one of ordinary skill in the art of semiconductor manufacturing. A common control gate 506 (or word line) couples flash memory cells 503 of a row 501 together, as shown in FIG. 5B. To form contacts to word lines, a conventional FLASH process is used that is known to one of ordinary skill in the art of flash memory manufacturing. The FLASH process includes, for example, forming spacers at opposite sides of control gate electrode to protect sides of the PLY2 and to provide alignment during subsequent salicidation of PLY2, deposition of an inter-layer dielectric ("ILD") to insulate PLY2 of each of word lines, and metallization to connect memory cells along the word line.

Referring to FIG. 5B, inter-poly dielectric 514 is deposited on PLY2 506. Inter-poly dielectric 514 may be deposited using one of techniques known to one of ordinary skill in the art of semiconductor manufacturing, e.g., using a blanket deposition technique. As shown in FIG. 5B, metal lines 508 (or bit lines) are formed over the inter-poly dielectric layer 514 to couple drain regions 518 of flash memory cells 503 of a column 502 together through, e.g., vias. The bit lines are formed in a first level metallization in a conventional FLASH process known to one of ordinary skill in the art.

Figure 5C:
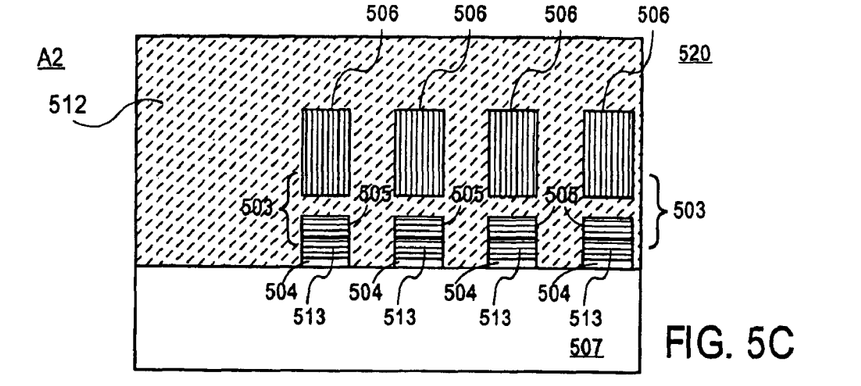
FIG. 5C shows a cross-sectional view of the block of one embodiment of a flash memory integrated circuit across line A2 in FIG. 5A.

FIG. 5C shows the cross-sectional view 520 of block 500 across line A2 between columns 502 in FIG. 5A. As shown in FIG. 5C, each of memory cells 503 comprises a PLY1 having fin 505 and base 513. Base 513 is deposited on tunnel oxide layer 504 on a substrate 507. An inter-poly dielectric layer 512 is deposited on the floating gate covering fin 505 and base 513. A polysilicon or amorphous silicon control gate ("PLY2") 506 is deposited on inter-poly dielectric layer 512. As shown in FIG. 5C, inter-layer dielectric 512 insulates a column of flash memory cells from an adjacent column of flash memory cells.

Figure 5D:
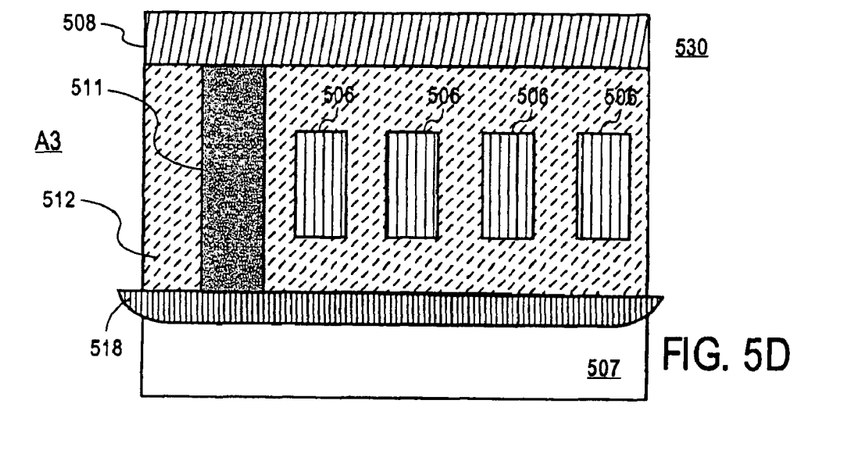
FIG. 5D shows a cross-sectional view of the block of one embodiment of a flash memory integrated circuit across line A3 in FIG. 5A.

FIG. 5D shows the cross-sectional view 530 of block 500 across line A3 in FIG. 5A. As shown in FIG. 5D, polysilicon or amorphous silicon control gates ("PLY2") 506 along columns 502 are separated from each other by inter-poly dielectric 512. Polysilicon or amorphous silicon control gates 506 are insulated from source/drain regions 518 in a substrate 507 by inter-poly dielectric 512, as shown in FIG. 5D. As shown in FIG. 5D, drain regions 518 of memory cells across each of columns 502 are connected through a respective via 511 to a metal line 508.

Figure 4A:
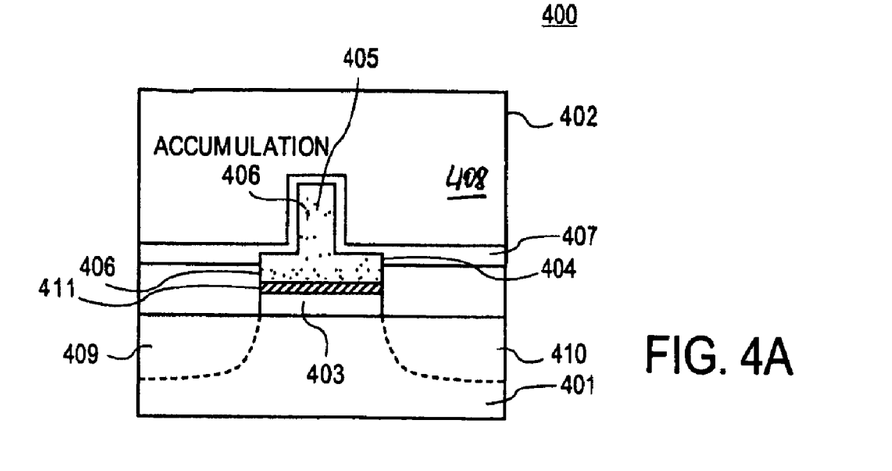
FIG. 4A illustrates read or program operation of one embodiment of a memory device.
Figure 4B:
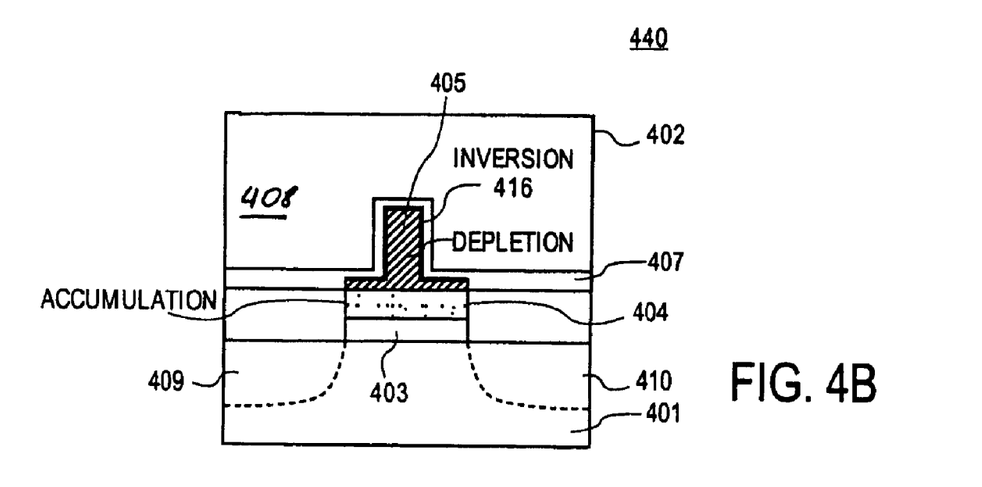
FIG. 4B illustrates an erase operation of one embodiment of the memory device.
Figure 4C:
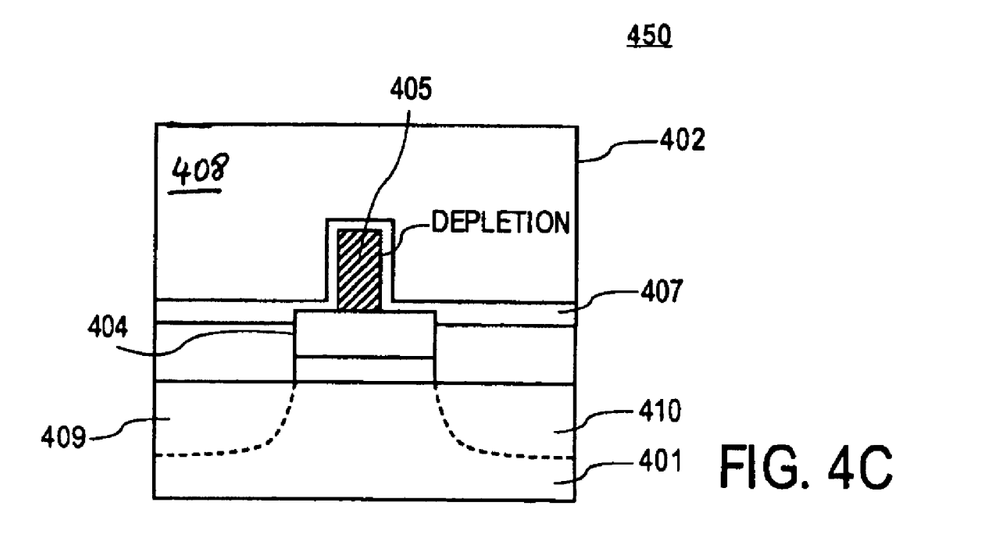
FIG. 4C illustrates an off-state condition of one embodiment of the memory device.

FIGS. 4A-4C illustrate an operation of one embodiment of a memory device 402 fabricated using methods described above with respect to FIGS. 2A-2R, 3 and 5A-5D.

FIG. 4A illustrates read or program operation 400 of one embodiment of a memory device 402. As shown in FIG. 4A, memory device 402 includes a PLY1 gate 411 on a tunnel oxide 403 on a substrate 401. PLY1 gate 411 has an n-type doped PLY1 gate base 404 on tunnel oxide 403 and an undoped PLY1 gate fin 405 formed on n-type doped PLY1 gate base 404. An n+-source region 409 and n+-drain region 410 are formed in a p-type silicon substrate 401 at opposite sides of PLY1 gate 411. An inter-poly dielectric ("IPD") 407, e.g., a stack of oxide/nitride/oxide, is formed on PLY1 gate 411 covering a top and sidewalls of fin 405 and portions of base 404. An n-type doped PLY2 gate 408 is formed on IPD 407. During read or program operation, a positive voltage, $V_{PLY2} > 0V$ is applied to a control PLY2 gate 408.

For a positive control gate voltage, the PLY1 fin 405 fills with electrons from the n-type PLY1 base 404 that are attracted to the positive potential applied to PLY 2 gate 408. That creates the carrier accumulation area 406 in PLY gate 411. The area 406 is indicated in FIG. 4A with a dotted pattern. The area 406 includes top and sidewalls of PLY1 fin 405 and portions of PLY1 base 404. That is, the area between control PLY2 gate 408 and floating PLY1 gate 411 is electrically increased. That provides an increased control gate-to-floating gate coupling resulting in the gate-coupling-ratio of at least 65%. Accumulation of electrons in the PLY1 fin 405 comes from the majority carriers in the floating PLY1 gate base 404 providing the depletion area adjacent to tunnel oxide 403. The depletion area is illustrated in FIG. 4A with diagonal lines. Because the concentration of n-type dopants in PLY1 base 404 is such that PLY1 is degenerately doped to provide majority carriers for PLY1 fin 405, carrier accumulation does not depend, e.g., on thermal generation of majority carriers. That results in the carrier accumulation fast enough to support even fast read and programming times of for example, about 10 ns (read time) and about 10 us (program time).

FIG. 4B illustrates an erase operation 440 of one embodiment of the memory device 402. During the erase operation, a negative voltage, $V_{PLY2} < 0V$, is applied to control PLY2 gate 408. The negative voltage applied to control PLY2 gate 408 creates an electrical field across the tunnel oxide 403 that allows electrons to tunnel out through a quantum mechanical tunneling mechanism away from PLY2 gate 408 into tunnel oxide 403. The bulk of PLY1 fin 405 becomes depleted of electrons. That creates an inversion layer 416 comprising of holes at the entire interface between PLY1 to IPD, along the top and sidewalls of the PLY1 fin 405 and portions of PLY1 base 404. That is, the whole area 416 between control PLY2 gate 408 and floating PLY1 gate 411 has the same potential that provides electrically increased coupling between the control PLY2 gate 408 and floating PLY1 gate 411. As a result, a gate-coupling-ratio of at least 65% is achieved. Because the inversion layer 416 is generated during typical hole generation-recombination time of microseconds, which is substantially smaller than the time of an order of milliseconds needed for erase operation, electrically increased coupling area during erase operation is always provided.

FIG. 4C illustrates an off-state condition 450 of one embodiment of memory device 402. During the off-state, or un-selected word line condition, a control PLY2 gate has zero voltage, $V_{PLY2} = 0V$. In the off-state, the undoped PLY1 fin 405 remains depleted from carriers. Such a depleted of carriers PLY1 fin 405 does not have a substantial electrical coupling to control PLY2 gate 408. The depleted PLY1 fin 405 during off-state condition is always considered as a dielectric by adjacent memory cells, even if the physical distance to adjacent memory cells is substantially small, e.g., less than 50 nm. That is, the depleted PLY1 fin 405 minimizes the floating gate-to-floating gate coupling between adjacent memory cells across word lines. Additionally, because the PLY1 base 404 is substantially thin and PLY2 gate 408 wraps around PLY1 fin 405, parasitic floating gate-to-floating gate coupling along the same word line is minimized down to a level that it does not limit the memory device operation.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus, comprising: a first insulating layer on a substrate; a first gate base on the insulating layer; a first gate fin on the first gate base, wherein the fin has a top and sidewalls, wherein the first gate fin is undoped, and the first gate base is degenerately doped; a second insulating layer on the top and sidewalls of the first gate fin; and a second gate over the second insulating layer.

2. The apparatus of claim 1, wherein the first gate fin includes an undoped polysilicon, and the first gate base includes an n-type polysilicon.

3. The apparatus of claim 1, wherein the first gate fin includes an undoped amorphous silicon, and the first gate base includes an n-type amorphous silicon.

4. The apparatus of claim 1, wherein each of the first gate fin and the first gate base includes an n-type dopant.

5. The apparatus of claim 1, wherein the width of the first gate fin is between 20 nm to 70 nm and the length of the first gate base is between 50 nm to 200 nm.

6. The apparatus of claim 1, wherein the thickness of the first gate fin is between 50 nm to 200 nm and the thickness of the first gate base is between 25 nm to 75 nm.

7. A flash memory integrated circuit, comprising: one or more floating gates on a first insulating layer on a substrate, wherein each of the one or more floating gates has a fin that is undoped on a base that is degenerately doped; a second insulating layer on the one or more floating gates, wherein the second insulating layer covers a top and sidewalls of the fin; and one or more second gates on the second insulating layer.

8. The circuit of claim 7, wherein the fin includes an undoped polysilicon, and the base includes an n-type polysilicon.

9. The circuit of claim 7, wherein the fin includes an undoped amorphous silicon, and the base includes an n-type amorphous silicon.

10. The circuit of claim 7, wherein each of the fin and the base has an n-type dopant.

* * * * *